(12) United States Patent
Hulse et al.

(10) Patent No.: US 7,686,478 B1
(45) Date of Patent: Mar. 30, 2010

(54) BULB FOR LIGHT-EMITTING DIODE WITH COLOR-CONVERTING INSERT

(75) Inventors: George R. Hulse, Arlington Heights, IL (US); Matthias Walther, Chicago, IL (US)

(73) Assignee: iLight Technologies, Inc., Chicago, IL (US)

( * ) Notice: Subject to any disclaimer, the term of this patent is extended or adjusted under 35 U.S.C. 154(b) by 0 days.

(21) Appl. No.: 12/120,418

(22) Filed: May 14, 2008

Related U.S. Application Data

(63) Continuation-in-part of application No. 11/945,691, filed on Nov. 27, 2007.

(60) Provisional application No. 60/957,915, filed on Aug. 24, 2007, provisional application No. 60/884,638, filed on Jan. 12, 2007.

(51) Int. Cl.
*F21V 9/10* (2006.01)

(52) U.S. Cl. .................. 362/255; 362/256; 362/293

(58) Field of Classification Search .................. 362/84, 362/231, 255, 256, 293, 800; 257/98, 99, 257/100; 313/110, 111, 112
See application file for complete search history.

(56) References Cited

U.S. PATENT DOCUMENTS

| | | | |
|---|---|---|---|
| 1,275,891 A * | 8/1918 | Flannery et al. ............. | 313/112 |
| 4,667,481 A | 5/1987 | Watanabe et al. | |
| 5,642,933 A | 7/1997 | Hitora | |
| 5,769,532 A | 6/1998 | Sasaki | |
| 5,786,665 A | 7/1998 | Ohtsuki et al. | |
| 5,803,579 A | 9/1998 | Turnbull et al. | |
| 6,102,559 A | 8/2000 | Nold et al. | |
| 6,132,072 A | 10/2000 | Turnbull et al. | |
| 6,132,345 A * | 10/2000 | Beierschmitt et al. ......... | 362/84 |
| 6,155,699 A * | 12/2000 | Miller et al. ................. | 362/293 |
| 6,227,679 B1 | 5/2001 | Zhang et al. | |
| 6,244,727 B1 | 6/2001 | Ryan, Jr. et al. | |
| 6,305,813 B1 | 10/2001 | Lekson et al. | |
| 6,371,637 B1 | 4/2002 | Atchinson et al. | |
| 6,404,131 B1 | 6/2002 | Kawano et al. | |

(Continued)

FOREIGN PATENT DOCUMENTS

DE 4003539 8/1991

(Continued)

OTHER PUBLICATIONS

ISA/US, Search Report and Written Opinion for International Application No. PCT/US08/50277, mailed Jun. 30, 2008.

*Primary Examiner*—Y My Quach Lee
(74) *Attorney, Agent, or Firm*—Stites & Harbison, PLLC; David W. Nagle, Jr.

(57) ABSTRACT

A bulb is adapted to fit over a light-emitting diode emitting a light of a first hue. The bulb is composed of a light-transmitting material and defines an inner cavity. The bulb includes a color-converting insert that is positioned in the inner cavity. The color-converting insert is also composed of a light-transmitting material and includes a light color-converting material. The light-emitting diode emits light of the first hue into the color-converting insert, which converts the light of the first hue into light of a desired hue, which is then emitted into the bulb and ultimately observed over a light-emitting surface of the bulb.

15 Claims, 3 Drawing Sheets

U.S. PATENT DOCUMENTS

| | | | |
|---|---|---|---|
| 6,409,361 B1 | 6/2002 | Ikeda | |
| 6,415,531 B1 | 7/2002 | Ohtsuki et al. | |
| 6,471,371 B1 | 10/2002 | Kawashima et al. | |
| 6,521,916 B2 | 2/2003 | Roberts et al. | |
| 6,523,976 B1 | 2/2003 | Turnbull et al. | |
| 6,536,914 B2 | 3/2003 | Hoelen et al. | |
| 6,550,949 B1 | 4/2003 | Bauer et al. | |
| 6,577,073 B2 | 6/2003 | Shimizu et al. | |
| 6,592,238 B2 | 7/2003 | Hulse et al. | |
| 6,609,804 B2 | 8/2003 | Nolan et al. | |
| 6,641,284 B2 | 11/2003 | Stopa et al. | |
| 6,657,382 B2 | 12/2003 | Nagai et al. | |
| 6,709,132 B2 | 3/2004 | Ishibashi | |
| 6,762,562 B2 | 7/2004 | Leong | |
| 6,800,996 B2 | 10/2004 | Nagai et al. | |
| 6,834,979 B1 | 12/2004 | Cleaver et al. | |
| 6,953,262 B2 | 10/2005 | Hulse et al. | |
| 7,005,679 B2 | 2/2006 | Tarsa et al. | |
| 7,008,079 B2 | 3/2006 | Smith | |
| 7,011,421 B2 | 3/2006 | Hulse et al. | |
| 7,021,797 B2 | 4/2006 | Minano et al. | |
| 7,036,956 B1 | 5/2006 | Chou | |
| 7,086,756 B2 | 8/2006 | Maxik | |
| 7,134,770 B2 | 11/2006 | Barlian et al. | |
| 7,157,839 B2 | 1/2007 | Ouderkirk et al. | |
| 7,158,020 B2 | 1/2007 | Grady, Jr. | |
| 7,168,823 B1 | 1/2007 | Jones | |
| 7,187,011 B2 | 3/2007 | Tasch et al. | |
| 7,188,970 B2 | 3/2007 | Hulse et al. | |
| 7,205,719 B2 | 4/2007 | Tain et al. | |
| 7,206,507 B2 | 4/2007 | Lee et al. | |
| 7,264,366 B2 | 9/2007 | Hulse | |
| 7,264,367 B2 | 9/2007 | Hulse | |
| 2001/0033488 A1 | 10/2001 | Chliwnyj et al. | |
| 2001/0046131 A1 | 11/2001 | Hoelen et al. | |
| 2002/0003700 A1 | 1/2002 | Selkee | |
| 2002/0030992 A1 | 3/2002 | Lefebvre et al. | |
| 2003/0002272 A1 | 1/2003 | Suchiro et al. | |
| 2003/0174504 A1 | 9/2003 | Tamaoki | |
| 2003/0198049 A1 | 10/2003 | Hulse et al. | |
| 2003/0210552 A1 | 11/2003 | Barlian et al. | |
| 2004/0027834 A1 | 2/2004 | Chigusa et al. | |
| 2004/0057234 A1 | 3/2004 | Mohacsi | |
| 2004/0080938 A1 | 4/2004 | Holman et al. | |
| 2004/0145895 A1 | 7/2004 | Ouderkirk et al. | |
| 2004/0150991 A1 | 8/2004 | Ouderkirk et al. | |
| 2004/0196643 A1 | 10/2004 | Terada et al. | |
| 2004/0207341 A1 | 10/2004 | Callahan | |
| 2005/0052871 A1 | 3/2005 | Leu et al. | |
| 2005/0057917 A1 | 3/2005 | Yatsuda et al. | |
| 2005/0168987 A1 | 8/2005 | Tamaoki et al. | |
| 2005/0195603 A1 | 9/2005 | Hulse | |
| 2005/0243550 A1 | 11/2005 | Stekelenburg | |
| 2006/0028837 A1 | 2/2006 | Mrakovich | |
| 2006/0039143 A1 | 2/2006 | Katoh et al. | |
| 2006/0082999 A1 | 4/2006 | Klein | |
| 2006/0138440 A1 | 6/2006 | Jyo | |
| 2006/0152139 A1 | 7/2006 | Hsieh et al. | |
| 2006/0193121 A1 | 8/2006 | Kamoshita | |
| 2006/0198119 A1 | 9/2006 | Hulse et al. | |
| 2006/0221594 A1 | 10/2006 | Thuot Rann et al. | |
| 2006/0262539 A1 | 11/2006 | Goulet et al. | |
| 2006/0289884 A1 | 12/2006 | Soules et al. | |
| 2007/0023763 A1 | 2/2007 | Takigawa et al. | |
| 2007/0024191 A1 | 2/2007 | Chen et al. | |
| 2007/0047227 A1 | 3/2007 | Ducharme | |
| 2007/0120135 A1 | 5/2007 | Soules et al. | |
| 2007/0215890 A1 | 9/2007 | Harbers et al. | |
| 2007/0267976 A1 | 11/2007 | Bohler et al. | |
| 2008/0246044 A1 * | 10/2008 | Pang .......................... 257/98 | |

FOREIGN PATENT DOCUMENTS

| | | |
|---|---|---|
| EP | 0982532 | 3/2000 |
| EP | 1748498 | 1/2007 |
| JP | 2005197717 | 1/2007 |
| JP | 2007005091 | 1/2007 |
| JP | 2007005372 | 1/2007 |
| JP | 2007005522 | 1/2007 |
| JP | 2007005549 | 1/2007 |
| JP | 2007018815 | 1/2007 |
| JP | 2007035802 | 2/2007 |
| JP | 2007103160 | 4/2007 |
| WO | 0131255 | 5/2001 |
| WO | 0208799 | 1/2002 |
| WO | 2006121625 | 11/2006 |
| WO | 2007075393 | 7/2007 |
| WO | 2007049187 | 11/2007 |

* cited by examiner

US 7,686,478 B1

BULB FOR LIGHT-EMITTING DIODE WITH COLOR-CONVERTING INSERT

CROSS-REFERENCE TO RELATED APPLICATIONS

The present application claims priority to U.S. Provisional Patent Application Ser. No. 60/957,915 filed on Aug. 24, 2007, and is also a continuation-in-part of U.S. patent application Ser. No. 11/945,691 filed on Nov. 27, 2007, which itself claims priority to U.S. Provisional Patent Application Ser. No. 60/884,638 filed on Jan. 12, 2007. The entire disclosures of each of these prior applications are incorporated herein by reference.

BACKGROUND OF THE INVENTION

The present invention is a bulb that fits over and/or around an LED, said bulb including a color-converting insert for converting the light emitted from the LED into light of a desired hue, which is then observed over the surface of the bulb.

Light-emitting diodes (LEDs) are now commonly used for a wide variety of general illumination and special effects illumination. For example, commonly assigned U.S. Pat. Nos. 6,592,238; 6,953,262; 7,188,970, which are incorporated in their entirety herein by this reference, each describe an illumination device for simulating neon lighting having a plurality of spaced LEDs positioned adjacent the light-receiving surface of a rod-like member or waveguide. The rod-like member/waveguide is made of a material that preferentially scatters light entering the light-receiving surface such that the light intensity pattern exiting a light-emitting surface of the rod-like member/waveguide is substantially uniform.

Nevertheless, the available visible color spectrum for illumination devices that use LEDs is limited by the finite availability of LED colors. Therefore, in commonly assigned U.S. Pat. Nos. 7,011,421; 7,264,366; and 7,264,367, each of which is also incorporated herein by this reference, illumination devices are described that use LEDs in conjunction with fluorescent and/or phosphorescent dyes, allowing for the emission of light in hues that cannot ordinarily be achieved through the use of LEDs alone.

SUMMARY OF THE INVENTION

The present invention is a bulb that fits over and/or around an LED, said bulb including a color-converting insert for converting the light emitted from the LED into light of a desired hue, which is then observed over the surface of the bulb.

An exemplary bulb made in accordance with the present invention is composed of a light-transmitting material and is adapted to fit over and/or around an LED. The bulb defines an inner cavity that is positioned over the LED, with a color-converting insert positioned in the inner cavity between the LED and the bulb.

When the bulb, including the color-converting insert, is fit over an LED, the LED emits light of a first hue into the insert. The light color-converting material in the insert converts the light of the first hue into light of a desired hue, which is then observed over the surface of the bulb. The light may be scattered before it is emitted from and observed over the surface of the bulb, such that the hue is substantially consistent and uniform over the surface of the bulb. In this regard, the hue of the light observed over the surface of the bulb is usually some combination of the light of the first hue and the hue of the light emitted from light color-converting material of the insert. In other words, unless all of the light emitted from the LED is absorbed by the light color-converting material of the insert, some of the light emitted from the LED will continue through the bulb such that the observed light is a combination of the light from the LED and the light from the light color-converting material of the insert.

By using a color-converting insert as opposed to providing the bulb itself with color-converting material, the bulb will not appear tinted when the LED is not energized. Furthermore, through use of the insert, the hue of the light observed over the surface of the bulb can be readily adjusted by exchanging the insert.

DETAILED DESCRIPTION OF THE INVENTION

The present invention is a bulb that fits over and/or around an LED, said bulb including a color-converting insert for converting the light emitted from the LED into light of a desired hue, which is then observed over the surface of the bulb.

For purposes of the discussion that follows, it is important to recognize that most perceived "colors" are not representative of light of a single wavelength, but rather some combination of wavelengths. In this regard, the dominant or perceived color of light comprised of some combination of wavelengths is generally referred to as hue. In order to provide a mechanism to represent and identify all possible perceived colors, the Commission Internationale l'Eclairage (CIE) constructed the CIE Chromaticity Diagram, which is based on three ideal primary light colors of red, green, and blue. The CIE Chromaticity Diagram is a well-known tool for identifying colors and is well understood by one of ordinary skill in the art. Specifically, since the x-axis of this CIE Chromaticity Diagram represents the amount of ideal red that would be mixed with ideal blue, and the y-axis of the CIE Chromaticity Diagram represents the amount of ideal green that would be mixed with ideal blue, a desired color can be identified in terms of its x and y coordinates. It is also important to recognize that the chromaticity curve, which is representative of the visible spectrum, is commonly superimposed over the chart such that wavelengths within the visible spectrum are represented along this curve.

Furthermore, the CIE Chromaticity Diagram is also helpful in understanding mixtures of primary light colors. Specifically, if a straight line is drawn between two points on the chromaticity curve, for example from green with a wavelength of 510 nm to red with a wavelength of 700 nm, that straight line illustrates the range of colors that could be created and perceived by the human eye, depending on the relative amounts of primary light colors in the mixture, including various yellowish-green colors and oranges. It is also important to recognize that the central region of the CIE Chromaticity Diagram is representative of white, a combination of the three ideal primary light colors. If any straight line between two colors on the chromaticity curve passes through this central region, those two colors can be mixed to create a perceived white color.

Figure 1:
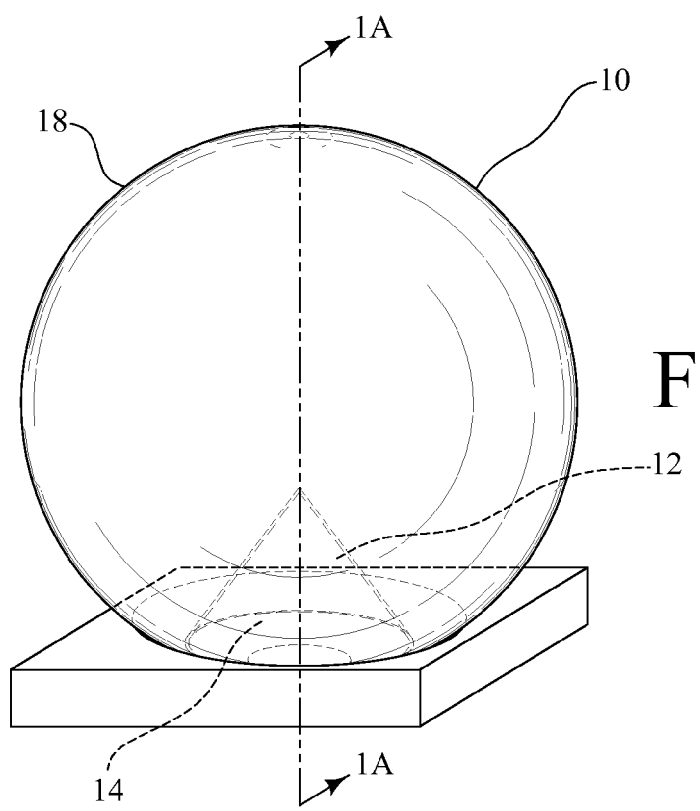
FIG. 1 is a perspective view of an exemplary bulb made in accordance with the present invention.
Figure 1A:
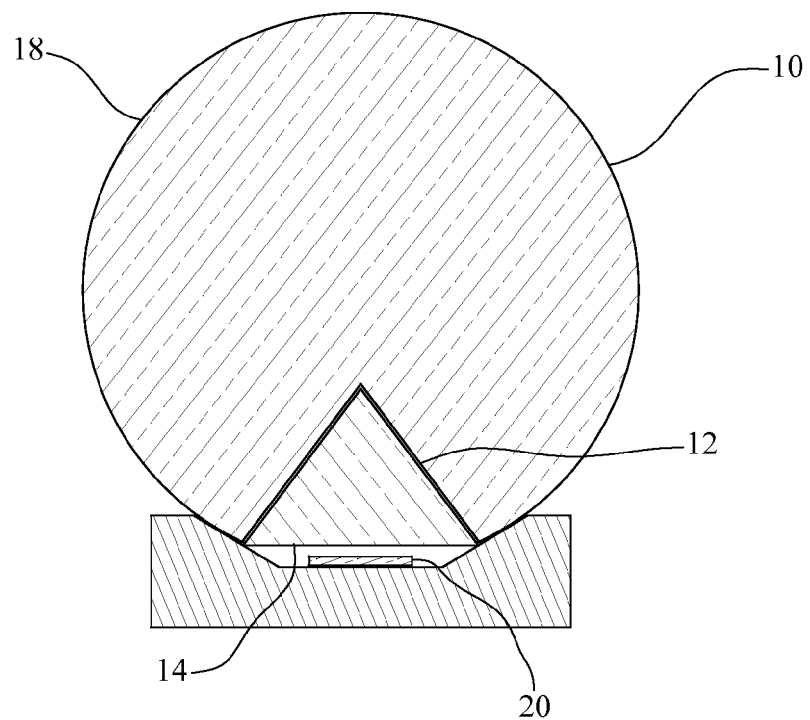
FIG. 1A is a sectional view of the exemplary bulb of FIG. 1 taken along line 1A-1A of FIG. 1.

Returning to the present invention, and referring first to FIGS. 1 and 1A, an exemplary bulb 10 is composed of a light-transmitting material and is adapted to fit over and/or around an LED 20. In this exemplary embodiment, the LED 20 is a 470-nm (blue) light-emitting diode distributed by Marktech Optoelectronics of Latham, N.Y. under part number LP9K03-B3. Furthermore, Applicants have discovered that a suitable light-transmitting material is a substantially translucent acrylic resin, for example, Plexiglas® Frosted DR-66080 White TL, manufactured and distributed by Arkema, Inc. of Puteaux, France and Philadelphia, Pa. (Plexiglas® is a registered trademark of Arkema, Inc.). This particular material has an inherent haze value (i.e., a measure of the scattering of light as it passes through the material) of approximately 98% according to American Society for Testing Materials (ASTM) Test Method D1003. The importance of the material scattering light passing through it is further described below.

Referring still to FIGS. 1 and 1A, the bulb 10 defines an inner cavity 12 that is positioned over the LED 20. In this example, the inner cavity 12 is in the form of a cone, with the base of the cone defining an opening at the base of the bulb 10. A color-converting insert 14 has a corresponding conical shape and is positioned in the inner cavity 12 defined by the bulb 10. This insert 14 is also composed of a light-transmitting material, such as an acrylic resin, for example, the aforementioned Plexiglas® Frosted DR-66080 White TL. More importantly, this insert 14 includes a light color-converting material, such as some predetermined combination of one or more fluorescent dyes, phosphorescent dyes, and/or other dyes or colorants that are mixed into the light-transmitting material. For example, suitable fluorescent dyes include Lumogen™ F240 (orange), Lumogen™ F170 (yellow), Lumogen™ F285 (pink), and Lumogen™ 850 (green), each of which may be acquired from BASF Corporation of Mount Olive, N.J. Since these dyes are typically manufactured and distributed in powdered form, the dyes can be mixed with pellets of the acrylic resin in an appropriate ratio. The mixture is then preferably dried for removal of moisture. The mixture can then be molded into the desired geometry.

As described below, the color-converting insert can have various shapes without departing from the spirit and scope of the present invention. However, with the inner cavity 12 in the form of a cone and the color-converting insert 14 having a corresponding conical shape, the proper positioning of the color-converting insert 14 relative to the LED 20 is ensured.

When the exemplary bulb 10, including the color-converting insert 14, is fit over the LED 20, the LED 20 emits light of a first hue into the insert 14. In this exemplary embodiment and as best illustrated in FIG. 1A, light from LED 20 can only enter the insert 14. The light color-converting material in the insert 14 converts the light of the first hue into light of a desired hue, which is then observed over a light-emitting surface 18 of the bulb 10. To the extent that the bulb 10 is composed of a material such as the Plexiglas® Frosted DR-66080 White TL acrylic resin described above, the light is scattered before it is emitted from and observed over the light-emitting surface 18 of the bulb 10. Thus, a more consistent and uniform hue over the light-emitting surface 18 of the bulb 10 can be achieved. In this regard, the hue of the light observed over the light-emitting surface 18 of the bulb 10 is usually some combination of the light of the first hue (from the LED 20) and the hue of the light emitted from light color-converting material of the insert 14 (i.e., a second hue). In other words, unless all of the light emitted from the LED 20 is absorbed by the light color-converting material of the insert 14, some of the light emitted from the LED 20 will continue through the bulb 10 such that the observed light is a combination of the light of the first hue (from the LED 20) and the light of the second hue (from the light color-converting material of the insert 14). For example, the LED 20 may emit light having a wavelength in the blue region (short wavelength and relatively high energy) of the color spectrum, and the light color-converting material may be an orange fluorescent dye, such that the mixed light approximates the hue and intensity of a conventional tungsten filament light source, i.e., the desired hue is white.

Figure 2:
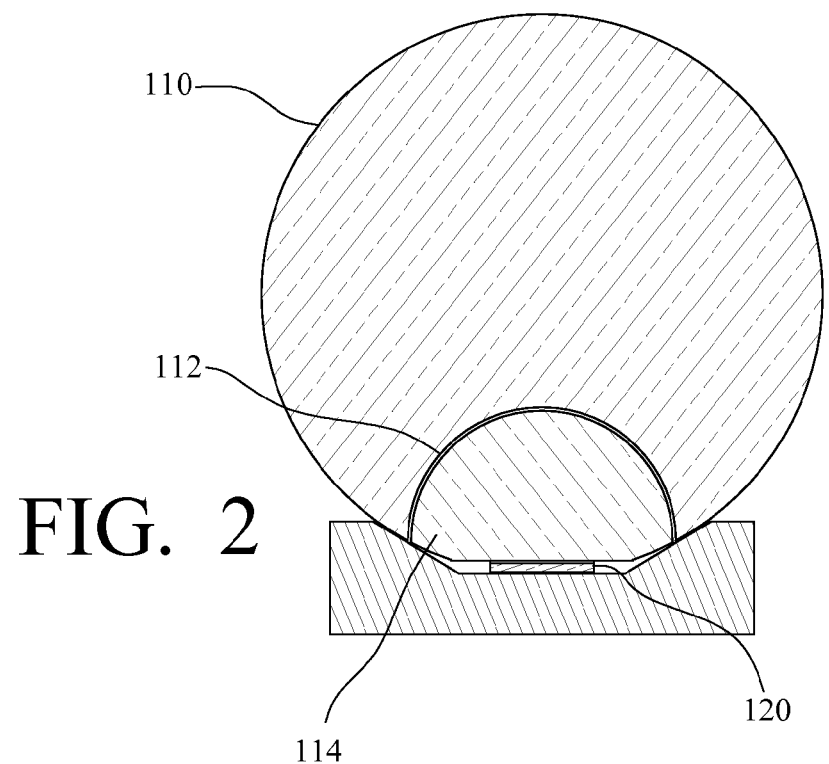
FIG. 2 is a sectional view of another exemplary bulb made in accordance with the present invention.

FIG. 2 is a sectional view of another exemplary bulb 110 made in accordance with the present invention. In this exemplary embodiment, the bulb 110 defines an inner cavity 112 that has a generally domed shape. The color-converting insert 114, which is positioned in the inner cavity 112 defined by the bulb 110, has a corresponding domed shape. Again, the insert 114 is composed of a light-transmitting material (such as a substantially translucent acrylic compound, polyurethane, or similar material) and a light color-converting material, such as some predetermined combination of one or more fluorescent dyes, phosphorescent dyes, and/or other dyes or colorants that are mixed into the light-transmitting material. When the exemplary bulb 110, including the color-converting insert 114, is fit over the LED 120, the LED 120 emits light of a first hue into the insert 114. As with the exemplary embodiment described above with respect to FIGS. 1 and 1A, light from LED 120 can only enter the insert 114. The light color-converting material in the insert 114 converts the light of the first hue into light of a desired hue, which is then observed over a light-emitting surface 118 of the bulb 110.

Figure 3:
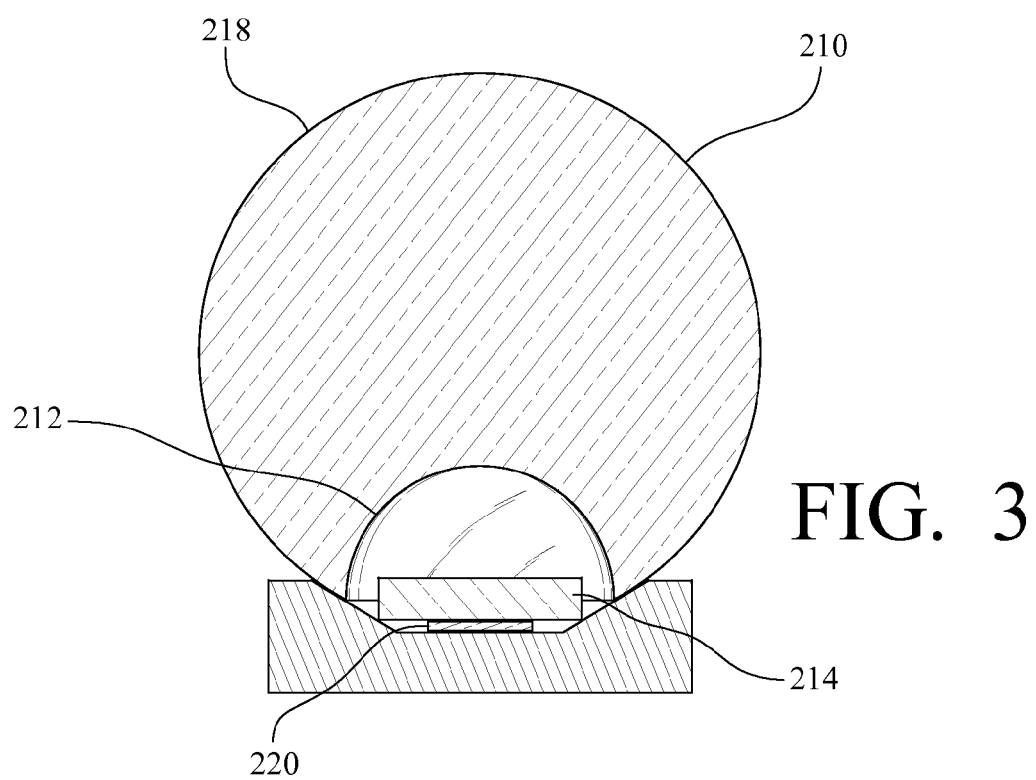
FIG. 3 is a sectional view of yet another exemplary bulb made in accordance with the present invention.

FIG. 3 is a sectional view of another exemplary bulb 210 made in accordance with the present invention. In this exemplary embodiment, the bulb 210 defines an inner cavity 212 that also has a generally domed shape. However, the color-converting insert 214, which is positioned in the inner cavity 212 defined by the bulb 210, is a generally circular and substantially flat disc. In other words, the insert 214 does not have a shape that corresponds to the shape of the inner cavity 212. Again, the insert 214 is composed of a light-transmitting material (such as a substantially translucent acrylic compound, polyurethane, or similar material) and a light color-converting material, such as some predetermined combination of one or more fluorescent dyes, phosphorescent dyes, and/or other dyes or colorants that are mixed into the light-transmitting material. When the exemplary bulb 210, including the color-converting insert 214, is fit over the LED 220, the LED 220 emits light of a first hue into the insert 214. As with the exemplary embodiments described above with respect to FIGS. 1, 1A and 2, light from LED 220 can only enter the insert 214. The light color-converting material in the insert 214 converts the light of the first hue into light of a desired hue, which is then observed over a light-emitting surface 218 of the bulb 210.

By using a color-converting insert 14, 114, 214 as opposed to providing the bulb 10, 110, 210 itself with color-converting material, the bulb 10, 110, 210 will not appear tinted when the LED 20, 120, 220 is not energized. Furthermore, through use of the insert 14, 114, 214, the hue of the light observed over the light-emitting surface 18, 118, 218 of the bulb 10, 110, 210 can be readily adjusted by exchanging the insert 14, 114, 214.

Figure 4:
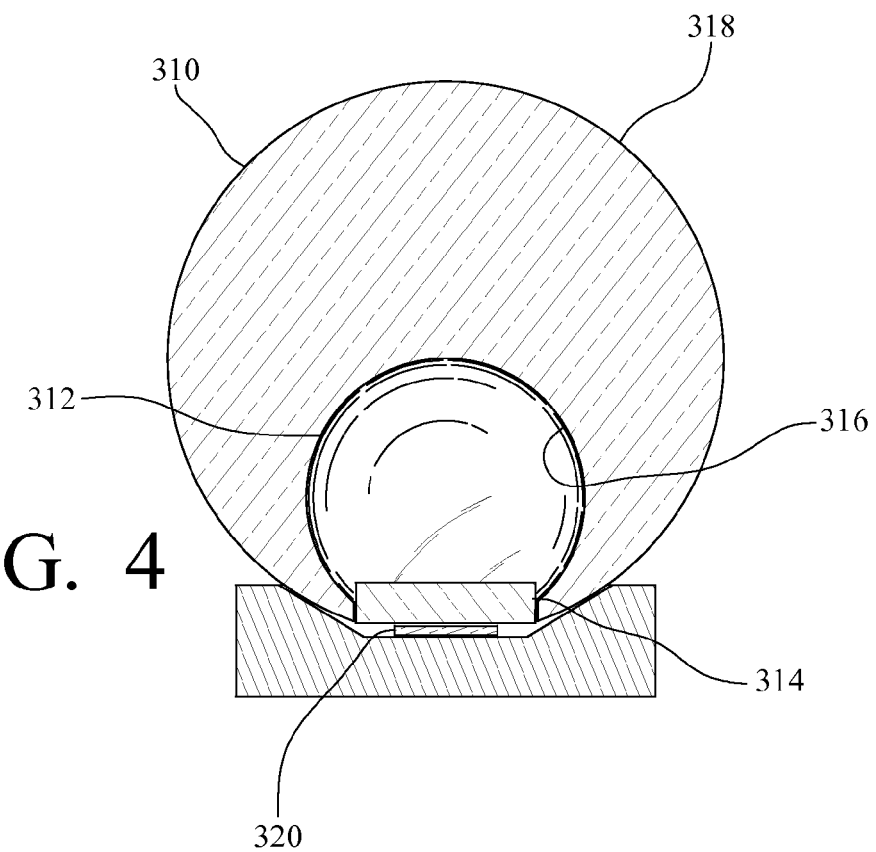
FIG. 4 is a sectional view of yet another exemplary bulb made in accordance with the present invention.

FIG. 4 is a sectional view of yet another exemplary bulb 310 made in accordance with the present invention. In this exemplary embodiment, the bulb 310 has a generally spherical shape and a substantially circular external cross-sectional geometry. The bulb 310 defines an inner cavity 312 that fits over and around an LED 320 that emits light in a generally Lambertian radiation pattern (the importance of which will be described below), such as the aforementioned 470-nm (blue) light-emitting diode distributed by Marktech Optoelectronics of Latham, N.Y. under part number LP9K03-B3. The exemplary bulb 310 further includes a light-receiving surface 316 defined by and within the inner cavity 312, along with a light-emitting surface 318. The inner cavity 312 also has a generally spherical shape and a substantially circular cross-sectional geometry. The color-converting insert 314, which is positioned in the inner cavity 312 defined by the bulb 310, is a generally circular and substantially flat disc (similar to the insert 214 described above with reference to FIG. 3). Again, the insert 314 is composed of a light-transmitting material (such as a substantially translucent acrylic compound, polyurethane, or similar material) and a light color-converting material, such as some predetermined combination of one or more fluorescent dyes, phosphorescent dyes, and/or other dyes or colorants that are mixed into the light-transmitting material.

Unlike the embodiments described above with references to FIGS. 1, 1A, and 2-3, however, the bulb 310 in this exemplary embodiment also includes a light color-converting material, such as some predetermined combination of one or more fluorescent dyes, phosphorescent dyes, and/or other dyes or colorants. Thus, when the exemplary bulb 310, including the color-converting insert 314, is fit over the LED 320, the LED 320 emits light of a first hue into the insert 314. As with the embodiments described above with references to FIGS. 1, 1A, and 2-3, the light color-converting material in the insert 314 converts the light of the first hue into light of a second hue. However, unlike the embodiments described above with references to FIGS. 1, 1A, and 2-3, the light color-converting material in the bulb 310 itself then converts the light of the second hue into light of a desired hue, which is then observed over a light-emitting surface 318 of the bulb 310.

As more fully described in U.S. patent application Ser. No. 11/945,778, which is incorporated herein by reference, by constructing the bulb 310 in this manner such that it has a generally spherical shape and a substantially circular external cross-sectional geometry, with an inner cavity that has a similar generally spherical shape and a substantially circular cross-sectional geometry, when the bulb 310 is placed over an LED 320 emitting light in a generally Lambertian radiation pattern, the result is a substantially consistent and generally uniform hue over the light-emitting surface 318 of the exemplary bulb 310. Specifically, the amount of light color-converting material in the bulb 310 that interacts with light emitted from the LED (through the insert 314) varies. At maximum brightness, there is the greatest distance between the insert 314 and the light-emitting surface 318 of the bulb 310, and light emitted from the LED 320 through the insert 314 along the vertical axis of the bulb (x=0) will thus pass through the greatest amount of the predetermined combination of one or more fluorescent dyes, phosphorescent dyes, and/or other dyes or colorants that are mixed into the light-transmitting material of the bulb 310. Conversely, at the bottom edge of the bulb 310, light emitted from the LED 320 through the insert 314 will pass through a minimal amount of the fluorescent dyes, phosphorescent dyes, and/or other dyes or colorants that are mixed into the light-transmitting material of the bulb. The result is a substantially consistent and generally uniform hue over the light-emitting surface 318 of the exemplary bulb 310. For such teachings, U.S. patent application Ser. No. 11/945,778 is incorporated herein by this reference.

Of course, the desired hue of the light observed over the light-emitting surface 318 of the bulb 310 is some combination of the light of the first hue (from the LED 320), the hue of the light emitted from light color-converting material of the insert 314 (i.e., a second hue), and the hue of the light emitted from light color-converting material of the bulb 310 (i.e., a third hue). In other words, unless all of the light emitted from the LED 320 is absorbed by the light color-converting material of the insert 314 and/or the light color-converting material of the bulb 310 itself, the observed light will be a combination of the light of the first hue (from the LED 320), the light of the second hue (from the light color-converting material of the insert 314), and the light of the third hue (from the light color-converting material of the bulb 310).

Figure 5:
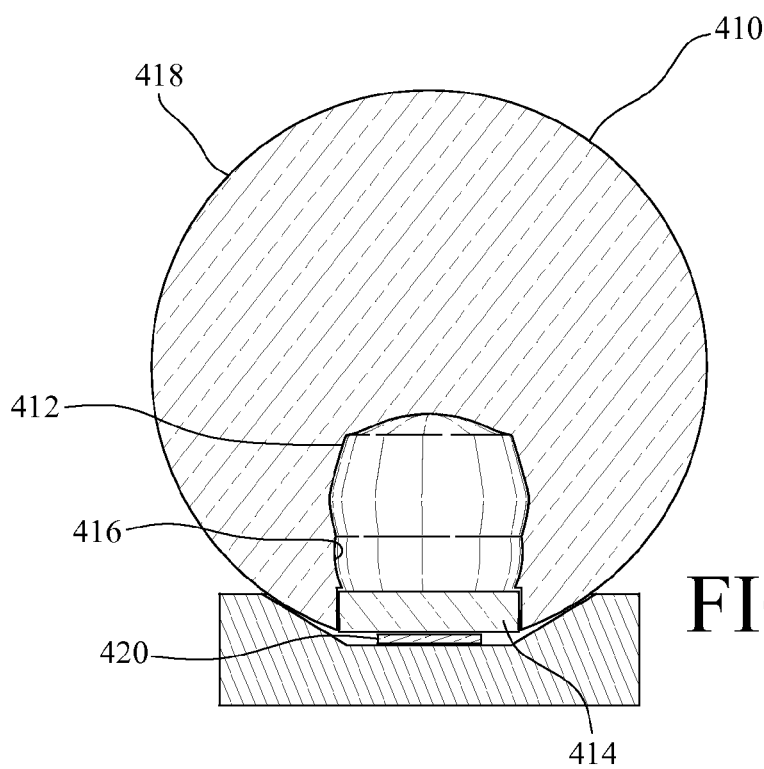
FIG. 5, is a sectional view of yet another exemplary bulb made in accordance with the present invention.

FIG. 5 is a sectional view of yet another exemplary bulb 410 made in accordance with the present invention. In this exemplary embodiment, the bulb 410 also has a generally spherical shape and a substantially circular external cross-sectional geometry. The bulb 410 defines an inner cavity 412 that fits over and around an LED 420 that emits light in a predetermined radiation pattern. For example, the LED 420 may be the aforementioned 470-nm (blue) light-emitting diode distributed by Marktech Optoelectronics of Latham, N.Y. under part number LP9K03-B3, which emits light in a generally Lambertian radiation pattern. The exemplary bulb 410 further includes a light-receiving surface 416 defined by and within the inner cavity 412, along with a light-emitting surface 418.

The exemplary bulb 410 is fit over and around the LED 420. A color-converting insert 414 is positioned in the inner cavity 412 defined by the bulb 410. The insert 414 is a generally circular and substantially flat disc (similar to the inserts 214, 314 described above with reference to FIGS. 3 and 4). Again, the insert 414 is composed of a light-transmitting material (such as a substantially translucent acrylic compound, polyurethane, or similar material) and a light color-converting material such as some predetermined combination of one or more fluorescent dyes, phosphorescent dyes, and/or other dyes or colorants that are mixed into the light-transmitting material. Similar to the embodiment described above with reference to FIG. 4, the bulb 410 also includes a light color-converting material, such as some predetermined combination of one or more fluorescent dyes, phosphorescent dyes, and/or other dyes or colorants.

In this case, the LED 420 emits light of a first hue in a predetermined radiation pattern into the insert 414. As with the exemplary embodiments described above, the light color-converting material in the insert 414 converts the light of the first hue into light of a second hue. Similar to the embodiment described above with reference to FIG. 4, the light color-converting material in the bulb 410 then converts the light of the second hue into light of a desired hue, which is then observed over the light-emitting surface 418 of the bulb 410.

In this exemplary embodiment, in order to ensure that the observed light has a substantially consistent and generally uniform hue over the light-emitting surface 418 of the exemplary bulb 410, Applicants have keyed the geometry of the bulb to the radiation pattern of the LED 420 to which it will be fit. Therefore, in order to have a bulb with the light-emitting surface 418 of a fixed geometric shape, such as a spherical bulb, the cross-sectional geometry of the light-receiving surface 416 defined by the inner cavity 412 must be modified based on the predetermined radiation pattern of the LED 420. Such modification is detailed in U.S. patent application Ser. No. 12/025,293, which is incorporated herein by reference.

With respect to the exemplary embodiments illustrated in FIGS. 4 and 5, by providing the bulbs 310, 410 themselves with a color-converting material, a desired hue can be approximated, and then through use of the inserts 314, 414, some tuning of the desired hue is possible. In other words, the desired hue as observed over the light-emitting surface 318, 418 of the respective bulbs 310, 410 through replacement or exchange of the respective inserts 314, 414.

As a further refinement, it should be recognized that a bulb made in accordance with the present invention could also be fit over and/or around multiple LEDs without departing from the spirit and scope of the present invention. In other words, a cluster of LEDs could be received in the inner cavity defined by the bulb.

Finally, as a further refinement with respect to the exemplary bulbs described above, the surface of each bulb can be roughened, stippled, or otherwise provided with a scattering material to disrupt or prevent a lensing effect at the surface as light exits the bulb.

One of ordinary skill in the art will recognize that additional embodiments are possible without departing from the teachings of the present invention or the scope of the claims which follow. This detailed description, and particularly the specific details of the exemplary embodiments disclosed herein, is given primarily for clarity of understanding, and no unnecessary limitations are to be understood therefrom, for modifications will become obvious to those skilled in the art upon reading this disclosure and may be made without departing from the spirit or scope of the claimed invention.

What is claimed is:

1. A bulb adapted to fit over at least one light-emitting diode emitting a light of a first hue in a predetermined radiation pattern, the bulb being composed of a light-transmitting material, the bulb having a generally spherical shape with a substantially circular external cross-sectional geometry, the bulb defining an inner cavity with a cross-sectional geometry based on the predetermined radiation pattern of the light-emitting diode, and the bulb including a color-converting insert that is positioned in said inner cavity, said color-converting insert also being composed of a light-transmitting material and including a light color-converting material, such that said light-emitting diode emits light of the first hue into said color-converting insert, which converts the light of the first hue into light of a desired hue, which is then observed over a light-emitting surface of the bulb.

2. The bulb as recited in claim 1, wherein said light color-converting material is one or more fluorescent dyes.

3. The bulb as recited in claim 1, wherein said light color-converting material is one or more phosphorescent dyes.

4. The bulb as recited in claim 1, wherein said light color-converting material is a combination of fluorescent dyes and/or phosphorescent dyes.

5. The bulb as recited in claim 1, wherein said light-transmitting material is an acrylic resin.

6. The bulb as recited in claim 5, wherein said light color-converting material is one or more fluorescent dyes mixed into said acrylic resin.

7. The bulb as recited in claim 1, wherein said color-converting insert has a shape corresponding to that of said inner cavity.

8. A lighting assembly, comprising:
at least one light-emitting diode emitting a light of a first hue in a predetermined radiation pattern;
a bulb fitting over the light-emitting diode, the bulb being composed of a light-transmitting material, the bulb having a generally spherical shape with a substantially circular external cross-sectional geometry and defining an inner cavity with a cross-sectional geometry based on the predetermined radiation pattern of the light-emitting diode, and the bulb defining a light-emitting surface; and
a color-converting insert that is positioned in the inner cavity defined by said bulb, said color-converting insert also being composed of a light-transmitting material and including a light color-converting material, such that said light-emitting diode emits light of the first hue into said color-converting insert, which converts the light of the first hue into light of a desired hue, which is then observed over the light-emitting surface of the bulb.

9. A bulb adapted to fit over at least one light-emitting diode emitting a light of a first hue in a generally Lambertian radiation pattern, said bulb having a generally spherical shape and a substantially circular external cross-sectional geometry, said bulb defining an inner cavity with a substantially circular cross-sectional geometry for housing the light-emitting diode, said bulb being composed of a light-transmitting material and a first light color-converting material, and said bulb further including a color-converting insert that is positioned in said inner cavity, said color-converting insert also being composed of a light-transmitting material and including a second light color-converting material, such that said light-emitting diode emits light of the first hue into said color-converting insert, which converts the light of the first hue into light of a second hue, which is then emitted into the bulb, which converts the light of the second hue into light of a desired hue, which is then observed over a light-emitting surface of the bulb.

10. A lighting assembly, comprising:
at least one light-emitting diode emitting a light of a first hue in a generally Lambertian radiation pattern;
a bulb fitting over the light-emitting diode, said bulb having a generally spherical shape and a substantially circular external cross-sectional geometry, said bulb defining an inner cavity with a substantially circular cross-sectional geometry for housing the light-emitting diode, said bulb being composed of a light-transmitting material and a first light color-converting material; and
a color-converting insert that is positioned in said inner cavity, said color-converting insert also being composed of a light-transmitting material and including a second light color-converting material, such that said light-emitting diode emits light of the first hue into said color-converting insert, which converts the light of the first hue into light of a second hue, which is then emitted into the bulb, which converts the light of the second hue into light of a desired hue, which is then observed over a light-emitting surface of the bulb.

11. A bulb adapted to fit over and around at least one light-emitting diode emitting a light of a first hue in a predetermined radiation pattern, said bulb being composed of a light-transmitting material and including a light color-converting material, said bulb defining an inner cavity having a cross-sectional geometry based on the predetermined radiation pattern of the light-emitting diode, said bulb including a color-converting insert that is positioned in said inner cavity, said color-converting insert also being composed of a light-transmitting material and including a second light color-converting material, such that said light-emitting diode emits light of the first hue into said color-converting insert, which converts the light of the first hue into light of a second hue, which is then emitted into the bulb, which converts the light of the second hue into light of a desired hue, which is then observed over a light-emitting surface of the bulb.

12. The bulb as recited in claim 11, wherein the bulb has a generally spherical shape.

13. A bulb adapted to fit over and around at least one light-emitting diode emitting a light of a first hue in a generally Lambertian radiation pattern, said bulb being composed of a light-transmitting material and including a light color-converting material, said bulb defining an inner cavity having a cross-sectional geometry based on the generally Lambertian radiation pattern of the light-emitting diode, said bulb including a color-converting insert that is positioned in said inner cavity, said color-converting insert also being composed of a light-transmitting material and including a second light color-converting material, such that said light-emitting diode emits light of the first hue into said color-converting insert, which converts the light of the first hue into light of a second hue, which is then emitted into the bulb, which converts the light of the second hue into light of a desired hue, which is then observed over a light-emitting surface of the bulb.

14. The bulb as recited in claim 13, wherein the bulb has a generally spherical shape.

15. A lighting assembly, comprising:
  at least one light-emitting diode emitting a light of a first hue in a predetermined radiation pattern; and
  a bulb fitting over and around the light-emitting diode, said bulb being composed of a light-transmitting material and including a first light color-converting material, said bulb defining an inner cavity having a cross-sectional geometry based on the predetermined radiation pattern of the light-emitting diode; and
  a color-converting insert that is positioned in the inner cavity defined by said bulb, said color-converting insert also being composed of a light-transmitting material and including a second light color-converting material, such that said light-emitting diode emits light of the first hue into said color-converting insert, which converts the light of the first hue into light of a second hue, which is then emitted into the bulb, which converts the light of the second hue into light of a desired hue, which is then observed over a light-emitting surface of the bulb.

\* \* \* \* \*